United States Patent [19]

Hill

[11] 4,093,910
[45] June 6, 1978

[54] NUCLEAR MAGNETIC RESONANCE PICK-UP CIRCUIT FOR CONTROL OF RESONANCE CONDITIONS

[75] Inventor: Howard D. W. Hill, Cupertino, Calif.

[73] Assignee: Varian Associates, Inc., Palo Alto, Calif.

[21] Appl. No.: 770,478

[22] Filed: Feb. 22, 1977

[51] Int. Cl.$^2$ ............................................. G01R 33/08
[52] U.S. Cl. ........................... 324/0.5 AH; 324/0.5 R
[58] Field of Search .......... 324/0.5 R, 0.5 A, 0.5 AC, 324/0.5 AH

[56] References Cited

U.S. PATENT DOCUMENTS

| | | | |
|---|---|---|---|
| 2,856,579 | 10/1958 | Packard | 324/0.5 R |
| 3,075,156 | 1/1963 | Anderson et al. | 324/0.5 R |

*Primary Examiner*—M. Tokar
*Attorney, Agent, or Firm*—Stanley Z. Cole; Gerald M. Fisher; Edward H. Berkowitz

[57] ABSTRACT

In a nuclear magnetic resonance spectrometer, the probe structure includes an analysis channel RF magnetic coil disposed in RF magnetic field exchanging relation with a sample of gyromagnetic resonators under analysis for detecting nuclear magnetic resonance of the sample. A control group of nuclear magnetic resonators is also disposed in the sample region and nuclear magnetic resonance of the control group is excited and detected by a second RF magnetic coil. The control RF coil is formed and arranged relative to the sample RF magnetic coil to minimize cross coupling between the sample and control channels. In a preferred embodiment, the control RF magnetic coil is coaxially disposed of the analysis RF coil and is further segmented into a pair of axially spaced portions disposed at opposite ends of the analysis coil and connected in magnetic field bucking relation relative to each other so that the RF magnetic field generated by the control RF coil cancels in the region of the analysis RF coil.

2 Claims, 1 Drawing Figure

NUCLEAR MAGNETIC RESONANCE PICK-UP CIRCUIT FOR CONTROL OF RESONANCE CONDITIONS

BACKGROUND OF THE INVENTION

The present invention relates in general to nuclear magnetic resonance spectroscopy and more particularly to an improved RF coil geometry for the control channel of the spectrometer.

DESCRIPTION OF THE PRIOR ART

Heretofore, nuclear magnetic resonance spectrometers have been proposed employing a single coil for exciting and detecting nuclear magnetic resonance of both the sample under analysis and the control group of gyromagnetic resonators. Since the resonant frequency of the control group was widely separated from the resonance frequency of the sample under analysis, a radio frequency choke was utilized to electrically separate the control channel from the analysis channel.

The problem with this arrangement is that it is not practical for use in a nuclear magnetic resonance spectrometer which is tunable over a wide band of frequencies, as of from 6 megahertz to 32 megahertz, as required for detecting resonance of a number of different nuclei such as $^{14}N$, at 6 megahertz; $^{15}N$ at 8 megahertz; $^2H$ at 12 megahertz; $^{13}C$ at 20 magahertz; and $^{31}P$ at 32 megahertz because the choke circuit would have to be tuned along with tuning of the RF coil of the analysis channel.

Therefore, it is desired to provide an improved method of electrically isolating the control and analysis channels one from the other, in a widely tunable nuclear magnetic resonance spectrometer.

SUMMARY OF THE PRESENT INVENTION

The principal object of the present invention is the provision of an improved nuclear magnetic resonance pick-up coil circuit for use in a nuclear magnetic resonance spectrometer tunable over a relatively wide band and including both a control and analysis channel, with the control and analysis samples disposed in a common region.

In one feature of the present invention, separate RF magnetic coils are utilized for sensing resonance of the analysis and control groups of nuclei with the coils being arranged such that the cross coupling between the two pick-up coils is minimized.

In another feature of the present invention, the control channel RF resonance pick-up coil is coaxially disposed of the analysis channel RF coil such control coil being segmented into axially spaced coil portions, such portions being disposed at opposite ends of the analysis RF pick-up coil and such coil segments being wound in magnetic field bucking relation so that the RF magnetic field from the control coil cancels in the region of the analysis pick-up coil.

Other features and advantages of the present invention will become apparent upon a perusal of the following specification taken in connection with the accompanying drawing wherein:

BRIEF DESCRIPTION OF THE DRAWING

The drawing is a schematic circuit diagram, partly in block diagram form of a nuclear magnetic resonance spectrometer incorporating features of the present invention.

DESCRIPTION OF THE PREFERRED EMBODIMENTS

Figure 1:
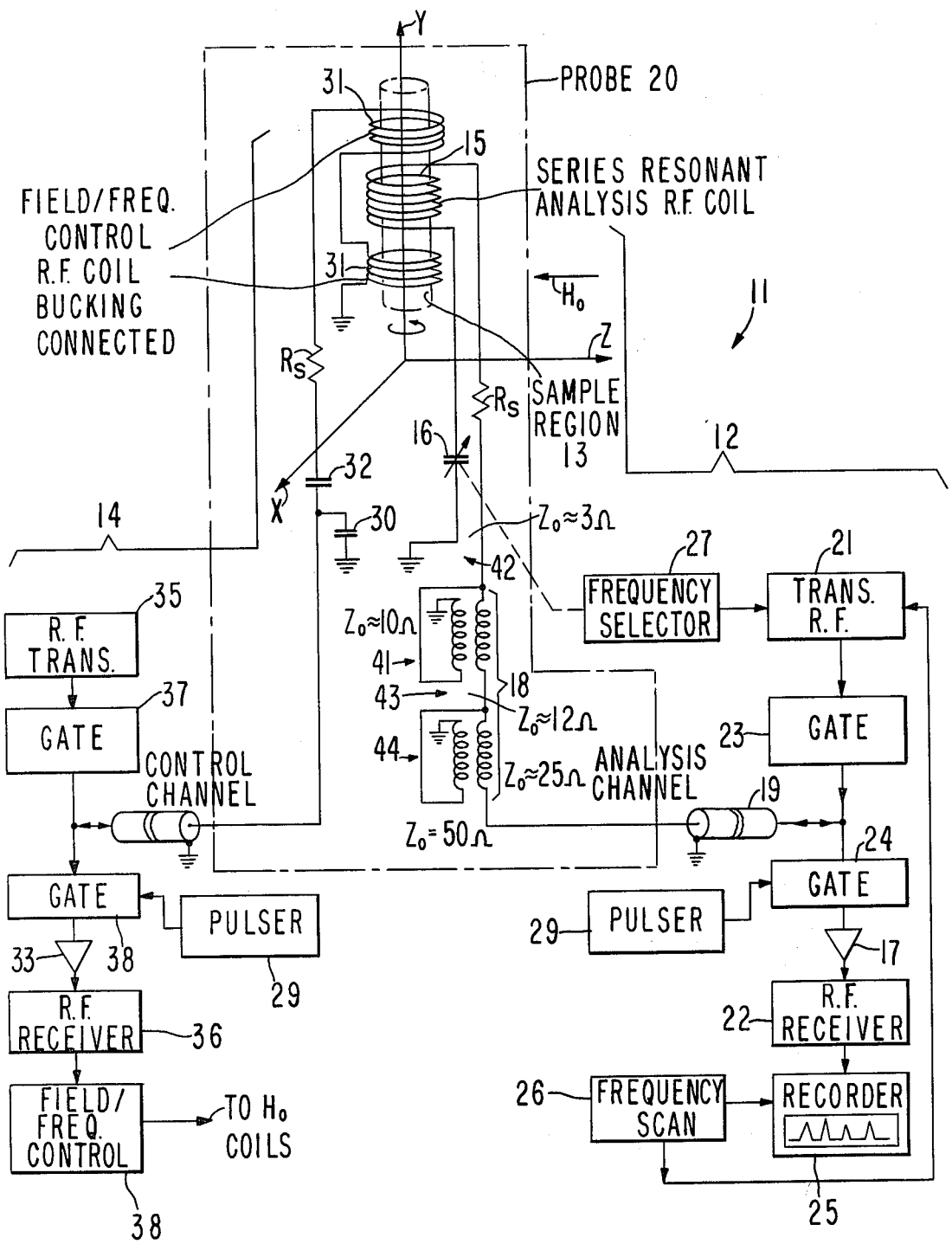

Referring now to FIG. 1 there is shown a wide tuning range nuclear magnetic resonance spectrometer 11 incorporating features of the present invention. The spectrometer 11 includes an analysis channel portion 12 for exciting and detecting nuclear magnetic resonance of a sample under analysis disposed within a tubular sample region 13 and a field frequency control channel 14 for exciting and detecting resonance of a control group of nuclear resonance bodies for controlling the resonance condition of the sample under analysis.

The sample under analysis within the sample region 13 is disposed in RF magnetic field exchanging relation with an RF magnetic pick-up coil 15, as of $1.6\mu h$ inductance comprising 14 turns of approximately 10 millimeter diameter, the coil being approximately 9 millimeters long. The coil 15 is series resonated with a variable capacitor 16 having a capacitance variable between a value of approximately 10 pf to a value of approximately 400 pf for tuning the series resonance of the RF pick-up coil 15 over a relatively wide tuning range, as of from 6 megahertz to 32 megahertz. The series resonant pick-up coil 15 includes a certain amount of resistance which appears as a series resistance $R_s$. In a typical example, the series resistance $R_s$ is approximately 3 ohms. The Q of the series tuned resonance circuit has a value of approximately 50.

The pick-up analysis coil 15 is wound around the sample region 13 with a magnetic axis parallel to the Y axis in the Cartesian set of coordinates, as shown. The sample is preferably spun by means of a conventional spinner with the axis of revolution being parallel to the Y axis. A polarizing magnetic field $H_0$, as of 18 kilogauss, is directed through the sample region 13 parallel to the Z axis. The series resonant analysis RF pick-up coil 15 is coupled to the input of an RF preamplifier 17 via the intermediary of a two stage transmission line impedance transformer 18 for matching the relatively low series resonant impedance, as of 1.5 to 5 ohms, of the series resonant pick-up coil to the input impedance of the amplifier 17, as of 50 ohms.

The transformer 18 and coil 15 are preferably disposed within a probe housing 20 disposed between the pole pieces of a magnet utilized for producing the polarizing field $H_0$. The output of the transformer 18 is coupled via a length of 50 ohm coaxial line 19 to a connection between an RF transmitter 21 and the RF preamplifier 17 and between respective gates 23 and 24. The RF preamplifier 17 feeds its output into an RF receiver 22 which receives the nuclear magnetic resonance signal picked up by the pick-up coil 15 and detects the preamplified received signal to produce a DC output resonance signal proportional to the amplitude of the detected resonance of the sample under analysis. The DC resonance signal is fed to a recorder 25 for recording as a function of frequency of the transmitter 21 which is scanned by means of a frequency scan output derived from frequency scanner 26 so that the output of the recorder is a recorded nuclear magnetic resonance spectrum of the sample under analysis.

One output of the frequency scan 26 is employed for controlling the frequency of the RF transmitter 21 for scanning the frequency of the RF transmitter 21 over a certain narrow range of frequencies, as of a few thousand hertz centered about the center frequency of the RF transmitter. The center frequency $f_0$ of the RF transmitter 21 is also tuned to the frequency bands of the several different nuclei under analysis falling within a frequency range of 6 to 32 megahertz. For example, a frequency selector 27 permits selection of a center frequency for the RF transmitter 21 of approximately 6 megahertz for the nuclei of $^{14}N$; 8 megahertz for the nuclei of $^{15}N$; 12 megahertz for the nuclei of $^{2}H$ 20 megahertz for the nuclei of $^{13}C$ and 32 megahertz for the nuclei of $^{31}P$. The frequency selector 27 also includes a tuning control for tuning the value of capacitor 16 for tuning the series resonant frequency of the series tuned pick-up coil 15 to the respective nuclear magnetic resonance frequencies of the aforecited nuclei.

The nuclear magnetic resonance spectrometer 11 is a spectrometer of the single coil type, that is, a common RF coil 15 serves both as the coil for applying the nuclear magnetic resonance exciting field to the sample under analysis and for picking up the resultant nuclear resonance of the sample. This is accomplished by time share multiplexing the transmitter 21 and the receiver 22 so that the transmitter sends out a pulse for exciting the resonance and then during an off period, the receiver 22 is gated on for receiving the resonance signal emanating from the excited sample under analysis.

The transmitter gate 23 may comprise a pair of parallel connected reverse poled diodes such that when the amplitude of the RF transmitter pulse exceeds a predetermined threshold value the pulse passes through the transmitter gate 23 by turning on the diodes and thence passes through the gate 23 to the coil 15.

A pulser 29, synchronized with the RF transmitter 21, preferably is employed for pulsing the receiver gate 24 on during the off times of the RF transmitter so that resonance signals picked up in the pick-up coil 15 pass through the receiver gate 24 to the preamplifier 17 and receiver 22, but strong RF transmitter pulses are blocked from the preamplifier 17 and receiver 22.

The field frequency control channel 14 includes means for exciting and detecting resonance of a control group of nuclear magnetic resonance bodies disposed within the sample region 13 to derive a signal for controlling the magnitude of the polarizing field $H_0$ to a predetermined value related to the resonance frequency of the known field frequency control sample. More particularly, the field frequency control channel 14 includes an RF exciting and detecting coil 31 coaxially disposed of the sample of the analysis coil 15 with the coil 31 being axially separated into two equal portions disposed at opposite ends of the analysis coil 15. The coil portions 31 are oppositely wound relative to the series current flow therethrough so that the RF fields produced by said separate portions cancel in the region bounded by the analysis coil 15. This is accomplished, in one embodiment, by causing the two halves of the field frequency RF coil 31 to be bucking wound so that the RF magnetic field generated in each half cancels in the center of the analysis coil 15. The field frequency RF coil 31 is tuned and impedance matched to 50 Ω by means of capacitors 30 and 32 at the nuclear magnetic resonant frequency of the control group of nuclei.

The tuned field frequency control coil 31 is coupled via a coaxial line 34 to a node between a control RF transmitter 35 and a control RF preamplifier 33 and receiver 36 and between respective gates 37 and 38. The gates 37 and 38 operate in the same manner as gates 23 and 24 for time share multiplexing the transmitter pulses to the received pulses from the control group of nuclear magnetic resonators.

The DC resonance signal derived from the output of the control RF receiver 36 is fed to a field frequency controller 38 to derive an output for driving a set of electromagnetic coils, not shown, used to control the total magnitude of the magnetic field $H_0$. The field frequency control signal derived from field frequency controller 38, has a magnitude and sign so as to sustain resonance of the field/frequency control group of nuclear magnetic resonators so that the intensity of the polarizing magnetic field $H_0$ is locked to the resonance of the control group of nuclear magnetic resonators. A pulser 29 drives the receiver gate 38 so as to gate on the receiver during the off time of the RF transmitter 35.

What is claimed is:

1. In a nuclear magnetic resonance spectrometer of the type having an analysis channel and a control channel coupled in radio frequency magnetic field exchanging relation via separate analyzing and control radio frequency coil means to a common region for containing both an analysis group of nuclear magnetic resonators and a control group of nuclear magnetic resonators for controlling the resonance conditions of both groups, the improvement wherein:

said control radio frequency coil means is formed and arranged relative to said analysis radio frequency coil means so that one of said coil means includes first and second spaced portions wound on a common axis for flow of the radio frequency current therethrough such that the RF magnetic field region produced by said spaced portions of said one coil means are in opposite directions within the region bounded by said other coil means.

2. The apparatus of claim 1 wherein said analysis coil means is said other coil means and is disposed in between said spaced portions of said control coil means.

* * * * *